(12) United States Patent
Chen et al.

(10) Patent No.: US 8,511,853 B2
(45) Date of Patent: Aug. 20, 2013

(54) POINT LIGHT SOURCE AND LIGHT SOURCE MODULE USING THE SAME

(75) Inventors: Chun-Kuang Chen, Hsinchu (TW); Chen-Yi Su, Hsinchu (TW)

(73) Assignee: Lextar Electronics Corporation, Hsinchu (TW)

( * ) Notice: Subject to any disclaimer, the term of this patent is extended or adjusted under 35 U.S.C. 154(b) by 250 days.

(21) Appl. No.: 13/030,636

(22) Filed: Feb. 18, 2011

(65) Prior Publication Data
US 2012/0044679 A1   Feb. 23, 2012

(30) Foreign Application Priority Data
Aug. 17, 2010   (TW) ................................ 99127490 A

(51) Int. Cl.
*F21V 5/00*   (2006.01)
*F21S 4/00*   (2006.01)
*H01L 33/62*   (2010.01)

(52) U.S. Cl.
USPC . 362/235; 362/246; 362/249.01; 362/249.02; 362/800; 257/99; 257/E25.02; 257/E33.066

(58) Field of Classification Search
USPC .................. 362/249.02, 249.03, 249.06, 235, 362/246, 249.01, 800; 257/730, E33.066, 257/91, 99, E25.02; 439/612
See application file for complete search history.

(56) References Cited

U.S. PATENT DOCUMENTS

| | | | |
|---|---|---|---|
| 6,851,831 B2 * | 2/2005 | Karlicek, Jr. | 362/249.06 |
| 6,891,200 B2 * | 5/2005 | Nagai et al. | 257/88 |
| 7,535,030 B2 * | 5/2009 | Lin | 257/99 |
| 7,553,162 B2 * | 6/2009 | Isoda et al. | 439/56 |
| 7,705,366 B2 * | 4/2010 | Seo et al. | 257/99 |
| 7,795,628 B2 * | 9/2010 | Ku | 257/88 |
| 7,824,073 B2 * | 11/2010 | Hsieh et al. | 362/249.11 |
| 7,832,897 B2 * | 11/2010 | Ku | 362/249.02 |
| 7,855,392 B2 * | 12/2010 | Wu et al. | 257/98 |
| 7,888,689 B2 * | 2/2011 | Kim et al. | 257/81 |
| 7,897,980 B2 * | 3/2011 | Yuan et al. | 257/88 |
| 7,944,708 B2 * | 5/2011 | Lin | 361/785 |
| 8,203,166 B2 * | 6/2012 | Chin | 257/99 |
| 8,210,734 B2 * | 7/2012 | Wu | 362/647 |
| 2008/0191235 A1 * | 8/2008 | Wang et al. | 257/99 |

* cited by examiner

*Primary Examiner* — Alan Cariaso
(74) *Attorney, Agent, or Firm* — WPAT, P.C.; Anthony King

(57) ABSTRACT

A point light source includes a light-emitting portion, a first lead and a second lead. The first lead and the second lead are electrically connected to the light-emitting portion. The first lead and the second lead respectively have a wedging portion. The wedging portions can be matched with each other. A light source module using the point light source is also provided. The light source module includes at least one light source assembly. Each light source assembly includes a plurality of the point light sources connected in series. Adjacent two point light sources are wedged to each other in series by a combination of the wedging portions of the adjacent first lead and second lead.

14 Claims, 4 Drawing Sheets

POINT LIGHT SOURCE AND LIGHT SOURCE MODULE USING THE SAME

FIELD OF THE INVENTION

The present invention relates to a point light source and a light source module using the same, and more particularly to point light sources capable of being wedged to each other and a light source module using the same.

BACKGROUND OF THE INVENTION

Since light emitting diodes (LEDs) have advantages of small size, low power consumption, fast response time and long service life, light emitting diodes have been widely used in communication products and consumer electronics in recent years.

In a conventional light source module using light emitting diodes, the light emitting diodes are fixed to a circuit board by surface mounted technology, and leads of the light emitting diodes are electrically connected to the circuit board by soldering tin. However, in the surface mounted technology, a reflow process is needed. The light emitting diodes and the circuit board may be damaged during passing through a reflow oven. As a result, luminous efficiency of the light emitting diodes is reduced or the light emitting diodes are not available, such that production yield of the light source module is reduced. Moreover, when the light emitting diodes are damaged, it is difficult and too time consuming to replace new light emitting diodes.

SUMMARY OF THE INVENTION

The present invention provides a point light source which can be wedged to another identical point light source.

The present invention also provides a light source module to improve production yield.

To achieve at least one of the above-mentioned advantages, the present invention provides a point light source including a light-emitting portion, a first lead and a second lead. The first lead and the second lead are electrically connected to the light-emitting portion. The first lead and the second lead respectively have a wedging portion. The wedging portions are matched with each other.

In one embodiment of the present invention, a structure of the first lead is the same as that of the second lead. Each of the first lead and the second lead further includes a base portion connected with the wedging portion. The light-emitting portion has a light-emitting surface and a back surface opposite to the light-emitting surface, and the back surface is connected with the base portions of the first lead and the second lead.

In one embodiment of the present invention, the wedging portion of the first lead and the wedging portion of the second lead are disposed on two opposite sides of the light-emitting portion.

In one embodiment of the present invention, the wedging portion includes a connecting portion and a crook portion. The connecting portion is connected between the crook portion and the base portion. A wedging groove is formed between the connecting portion, the crook portion and the base portion, and a shape of the wedging groove is matched with that of the crook portion.

In one embodiment of the present invention, the light-emitting portion is a rectangular solid. The wedging portion of the first lead and the wedging portion of the second lead are disposed beside two opposite ends of one of catercorners of the light-emitting portion.

In one embodiment of the present invention, the connecting portion is perpendicular to the crook portion.

In one embodiment of the present invention, the point light source is a light emitting diode or a laser.

The present invention also provides a light source module including at least one light source assembly. The light source assembly includes a plurality of point light sources connected in series. Each two adjacent point light sources are wedged to each other in series by a combination of the wedging portions of the adjacent first lead and second lead.

In one embodiment of the present invention, the light source module includes a plurality of the light source assemblies, the adjacent two light source assemblies are wedged to each other in parallel by a combination of the wedging portions of the adjacent first leads.

In one embodiment of the present invention, the light source module further includes a diffusion plate disposed above the light source assembly.

In one embodiment of the present invention, the point light sources of each light source assembly are arranged in a line.

In one embodiment of the present invention, the light source module further includes a base and a transparent cover. The base has a circuit board. The light source assembly is disposed on the circuit board and is electrically connected to the circuit board. The transparent cover is combined with the base and covers the circuit board and the light source assembly.

Since the first lead and the second lead of the point light source of the present invention respectively have a wedging portion and the wedging portions are matched with each other, the adjacent point light sources can be connected to each other by the wedging portions to form the light source assembly. In such way, the point light sources need not be fixed to a circuit board by surface mounted technology. The point light sources can be prevented from being damaged, and thus production yield of the light source module of the present invention is improved.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
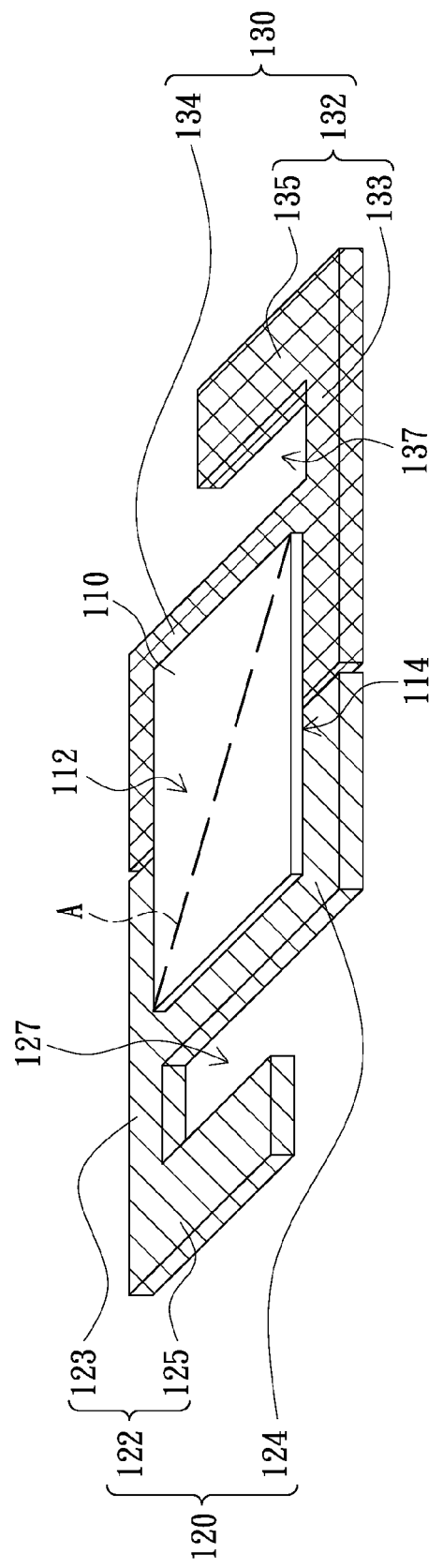
FIG. 1 is a schematic, three-dimensional view of a point light source according to an embodiment of the present invention.

FIG. 1 is a schematic, three-dimensional view of a point light source according to an embodiment of the present invention. Referring to FIG. 1, a point light source 100 of the present embodiment can be, but not limited to, a light emitting diode or a laser. The point light source 100 includes a light-emitting portion 110, a first lead 120 and a second lead 130. The first lead 120 and the second lead 130 are electrically connected to the light-emitting portion 110. The first lead 120 and the second lead 130 respectively have a wedging portion 122, 132. The wedging portion 122 and the wedging portion 132 can be matched with each other.

The light-emitting portion 110 has a light-emitting surface 112 and a back surface 114 opposite to the light-emitting surface 112. The first lead 120, for example, further has a base portion 124 connected with the wedging portion 122. The second lead 130, for example, further has a base portion 134 connected with the wedging portion 132. The back surface 114 of the light-emitting portion 110 is connected with the base portions 124, 134. Furthermore, one of the first lead 120 and the second lead 130 is an anode lead, and the other of the first lead 120 and the second lead 130 is a cathode lead. The wedging portion 132 of the second lead 130 and the wedging portion 122 of the first lead 120 are, for example, disposed on two opposite sides of the light-emitting portion 110. More specifically, the light-emitting portion 110 is, for example, a rectangular solid. The wedging portion 122 of the first lead 120 and the wedging portion 132 of the second lead 130 are, for example, disposed beside two opposite ends of one of catercorners A of the light-emitting portion 110.

In the present embodiment, the wedging portion 122 of the first lead 120, for example, includes a connecting portion 123 and a crook portion 125. The connecting portion 123 is connected between the crook portion 125 and the base portion 124. The connecting portion 123 is, for example, perpendicular to the crook portion 125. A wedging groove 127 is formed between the connecting portion 123, the crook portion 125 and the base portion 124. Additionally, the wedging portion 132 of the second lead 130, for example, includes a connecting portion 133 and a crook portion 135. The connecting portion 133 is connected between the crook portion 135 and the base portion 134. The connecting portion 133 is, for example, perpendicular to the crook portion 135. A wedging groove 137 is formed between the connecting portion 133, the crook portion 135 and the base portion 134. A shape of the wedging grooves 127, 137 can be matched with that of the crook portions 125, 135. That is, either of the crook portions 125, 135 can be wedged in either of the wedging grooves 127, 137.

In the present embodiment, a shape of the wedging portion 122 of the first lead 120 is the same as that of the wedging portion 132 of the second lead 130. The wedging portion 122 and the wedging portion 132 can be wedged to each other. However, the shape of the wedging portions 122, 132 of the present invention is not limited to the present embodiment. In other embodiments, the shape of the wedging portions 122, 132 can be changed, as long as the wedging portion 122 and the wedging portion 132 can be wedged to each other.

Figure 2:
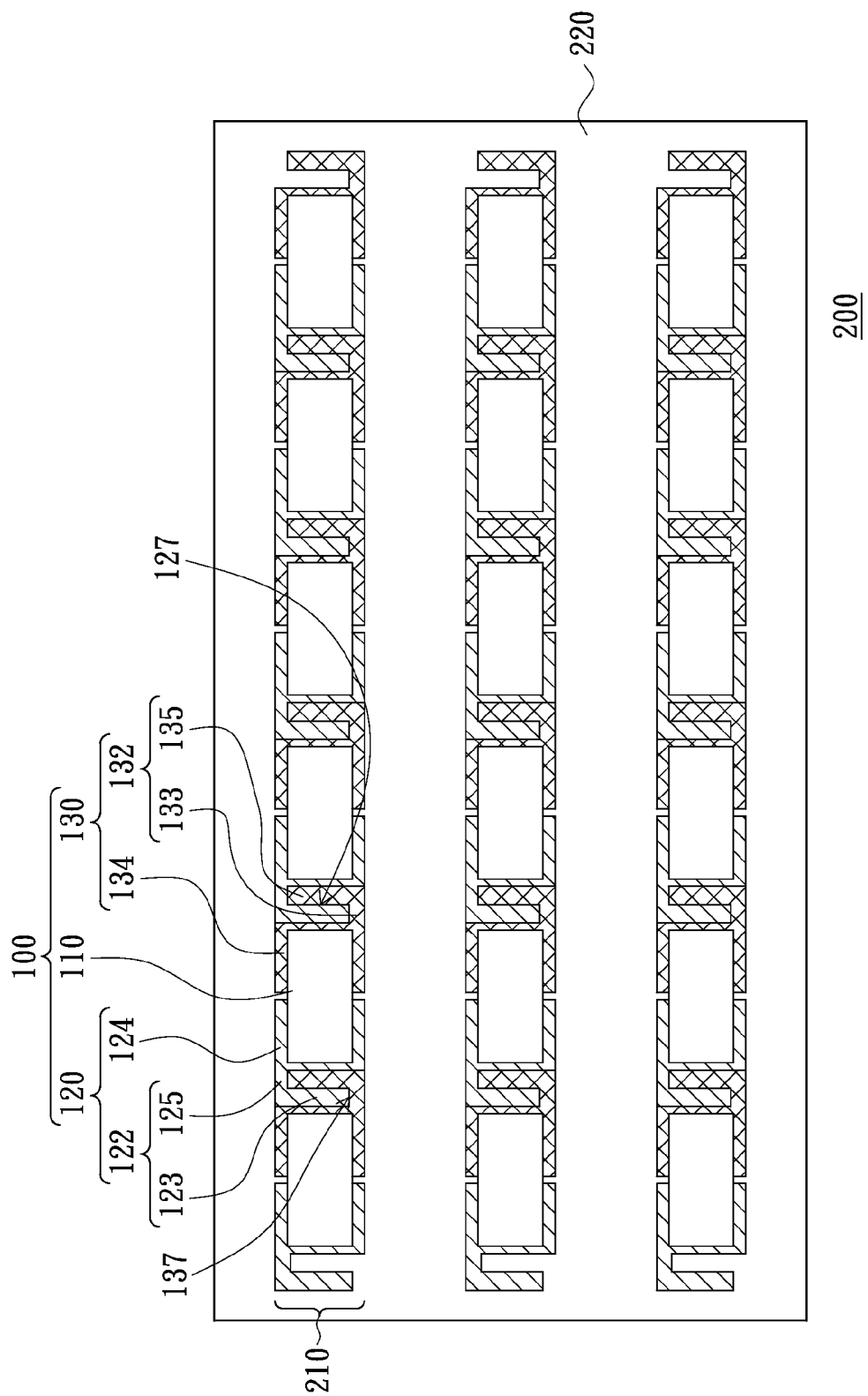
FIG. 2 is a schematic, top view of a light source module according to an embodiment of the present invention.

A light source module using the point light source 100 will be described below. FIG. 2 is a schematic, top view of a light source module according to an embodiment of the present invention. Referring to FIG. 2, a light source module 200 of the present embodiment includes at least one light source assembly 210. Three light source assemblies 210 are taken as an example in FIG. 2, but the present embodiment does not limit a number of the light source assembly 210. Each light source assembly 210 includes a plurality of the point light sources 100 connected in series. Six point light sources 100 are taken as an example in FIG. 2, but the present embodiment does not limit a number of the point light sources 100.

The point light sources 100 are, for example, arranged in a line. Adjacent two point light sources 100 are wedged to each other in series by the wedging portions 122, 132 of the first lead 120 and the second lead 130. More specifically, in adjacent two point light sources 100, the crook portion 125 of the first lead 120 of one point light source 100 is wedged in the wedging groove 137 of the second lead 130 of another point light source 100. In addition, the crook portion 135 of the second lead 130 of one point light source 100 is wedged in the wedging groove 127 of the first lead 120 of another point light source 100. So that, the point light sources 100 are connected in series.

In the present embodiment, since the point light sources 100 of the light source assemblies 210 can be wedged to each other, the point light sources 100 can be connected to form a linear light source, and the point light sources 100 need not be fixed a circuit board by surface mounted technology. In such way, the point light sources 100 can be prevented from being damaged so as to improve production yield. Furthermore, since adjacent two point light sources 100 are connected to each other by a wedging method, the point light sources 100 are easily reworked when the combination of the point light sources 100 is bad, or the point light sources 100 are easily changed when the point light sources 100 are damaged.

Figure 3:
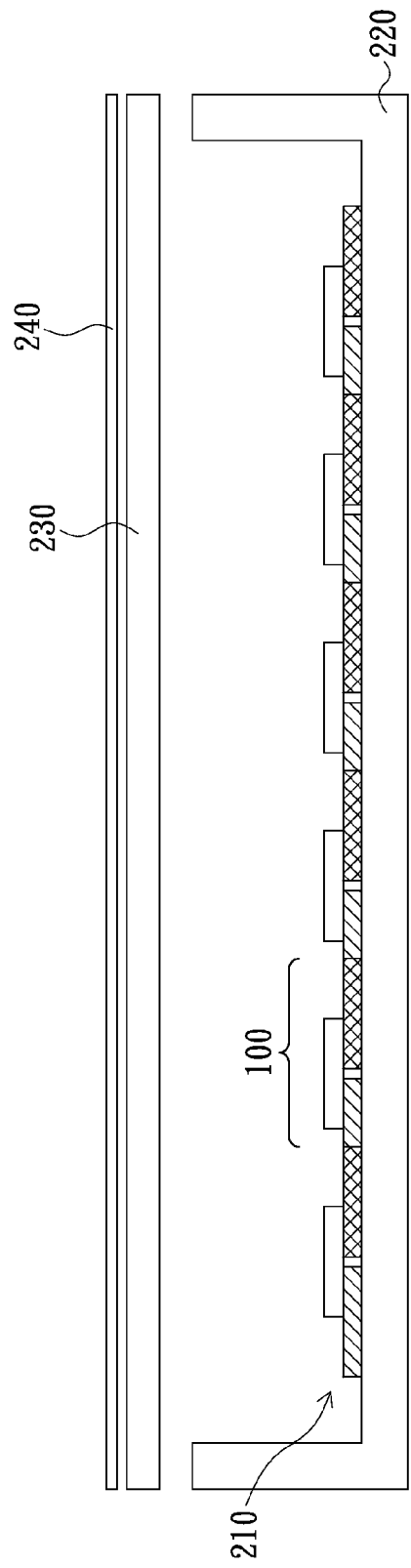
FIG. 3 is a schematic, cross-sectional view of a light source module according to another embodiment of the present invention.

When the light source module 200 of the present embodiment is a backlight module, the light source assemblies 210 can be directly disposed on a back plate 220. Additionally, as shown in a light source module 200' of FIG. 3, a diffusion plate 230 can be disposed above the back plate 220, and optical films, such as diffusion film, brightness enhancement film and so on, can be disposed on the diffusion plate 230.

Figure 4:
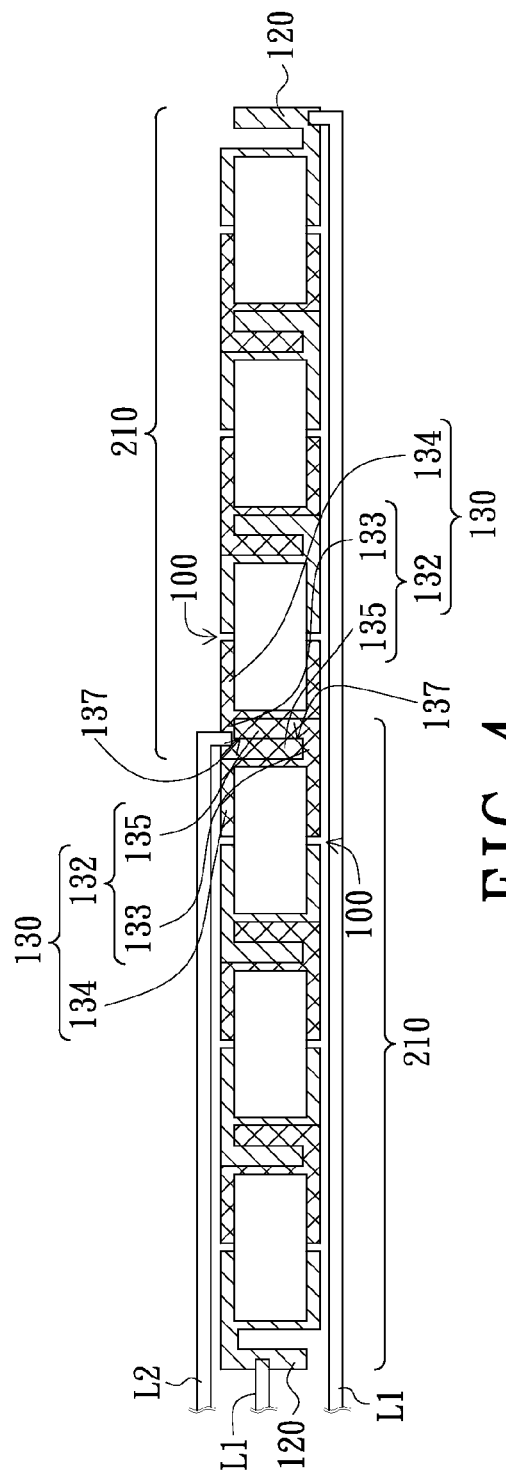
FIG. 4 is a schematic view of a light source module according to an embodiment of the present invention, showing two light source assemblies connected in parallel.

It should be noted that, although the light source modules 200, 200' are backlight modules, but the present invention does not limit the application area of the light source modules 200, 200'. Furthermore, as shown in FIG. 4, adjacent two light source assemblies 210 can be connected in parallel. For example, two light source assemblies 210 are, for example, wedged to each other in parallel by wedging portions 132 of the second leads 130 of the adjacent point light sources 100. More specifically, in adjacent two point light sources 100 of adjacent two light source assemblies 210, the crook portion 135 of the second lead 130 of one point light source 100 is wedged in the wedging groove 137 of the second lead 130 of another point light source 100, so that the adjacent two light source assemblies 210 are connected in parallel. In FIG. 4, the first leads 120 disposed on the left end and the second end can be electrically connected to a first electrode by metal conductors L1 or by metal wires disposed on a circuit board (not shown). The second leads 130 of the two light source assemblies 210 connected to each other can be electrically connected to a second electrode by metal conductors L2 or by metal wires disposed on the circuit board. The first electrode and the second electrode can respectively be anode and cathode, or the first electrode and the second electrode can respectively be cathode and anode.

Figure 5:
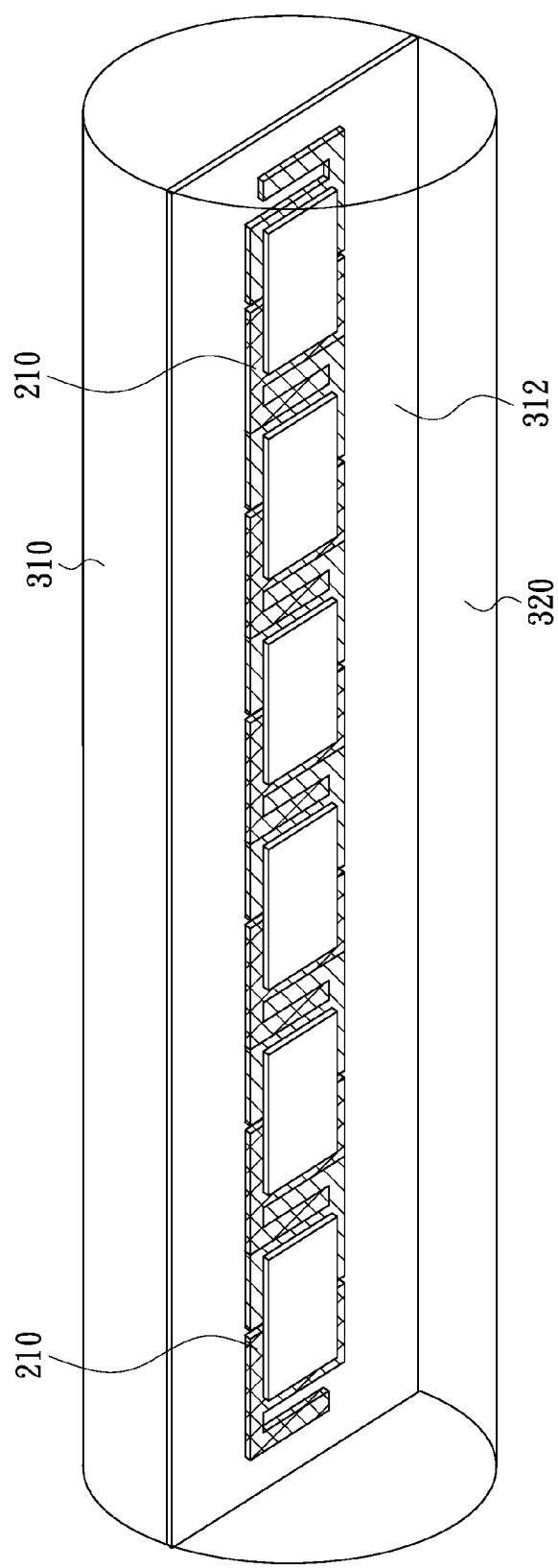
FIG. 5 is a schematic view of a light source module according to another embodiment of the present invention.

FIG. 5 is a schematic view of a light source module according to another embodiment of the present invention. Referring to FIG. 5, a light source module 300 of the present embodiment includes a base 310, a transparent cover 320 and two light source assemblies 210 connected in parallel of FIG. 4. The base 310 has a circuit board 312. The two light source assemblies 210 connected in parallel are disposed on the circuit board 312 and are electrically connected to metal wires (not shown) of the circuit board 312. The transparent cover 320 is combined with the base 310 and covers the circuit board 312 and the two light source assemblies 210 connected in parallel. In the present embodiment, shapes of the base 310 and the transparent cover 320 are semi-cylindrical. Furthermore, the two light source assemblies 210 connected in parallel can be replaced by a single light source assembly 210 or a plurality of light source assemblies 210 connected in series.

In summary, the point light source and the light source module using the same of the present invention at least have one of the following advantages:

1. Since the first lead and the second lead of the point light source of the present invention respectively have a wedging portion and the wedging portions are matched with each other, the point light source can be wedged to another identical point light source.

2. In the light source module of the present invention, since a plurality of the point light sources can be wedged to each other to form the light source assembly by the combinations of the wedging portions, the point light sources need not be fixed to the circuit board by surface mounted technology. In such way, the point light sources can be prevented from being damaged so as to improve production yield.

3. Since the adjacent two point light sources are connected to each other by wedging method, the point light sources are easily reworked or changed.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A point light source comprising:
a light-emitting portion;
a first lead electrically connected to the light-emitting portion; and
a second lead electrically connected to the light-emitting portion, wherein the first lead and the second lead respectively have a wedging portion, and the wedging portions of the first lead and the second lead have complementary shapes with respect to each other; wherein a structure of the first lead is the same as that of the second lead, each of the first lead and the second lead further comprises a base portion connected with the wedging portion, the light-emitting portion has a light-emitting surface and a back surface opposite to the light-emitting surface, and the back surface is connected with the base portions of the first lead and the second lead; wherein the wedging portion comprises a connecting portion and a crook portion, the connecting portion is connected between the crook portion and the base portion, a wedging groove is formed between the connecting portion, the crook portion and the base portion, and a shape of the wedging groove is matched with that of the crook portion.

2. The point light source according to claim 1, wherein the wedging portion of the first lead and the wedging portion of the second lead are disposed on two opposite sides of the light-emitting portion.

3. The point light source according to claim 1, wherein the light-emitting portion is a rectangular solid, the wedging portion of the first lead and the wedging portion of the second lead are disposed beside two opposite ends of one of cater-corners of the light-emitting portion.

4. The point light source according to claim 1, wherein the connecting portion is perpendicular to the crook portion.

5. The point light source according to claim 1, wherein the point light source is a light emitting diode or a laser.

6. A light source module comprising:
at least one light source assembly, wherein the light source assembly comprises a plurality of point light sources connected in series, each point light source comprises:
a light-emitting portion;
a first lead electrically connected to the light-emitting portion; and
a second lead electrically connected to the light-emitting portion, the first lead and the second lead respectively having a wedging portion, the wedging portions of the first lead and the second lead having complementary shapes with respect to each other, and each two adjacent point light sources being wedged to each other in series by an engagement of the wedging portions of the adjacent first lead and second lead; wherein a structure of the first lead of each point light source is the same as that of the second lead of each point light source, each of the first lead and the second lead of each point light source further comprises a base portion connected with the wedging portion, the light-emitting portion has a light-emitting surface and a back surface opposite to the light-emitting surface, and the back surface is connected with the base portions of the first lead and the second lead; wherein the wedging portion comprises a connecting portion and a crook portion, the connecting portion is connected between the crook portion and the base portion, a wedging groove is formed between the connecting portion, the crook portion and the base portion, and a shape of the wedging groove is matched with that of the crook portion.

7. The light source module according to claim 6, comprising a plurality of the light source assemblies, wherein the adjacent two light source assemblies are wedged to each other in parallel by a combination of the wedging portions of the adjacent first leads.

8. The light source module according to claim 6, wherein the wedging portion of the first lead and the wedging portion of the second lead of each point light source are disposed on two opposite sides of the light-emitting portion.

9. The light source module according to claim 6, wherein the light-emitting portion is a rectangular solid, the wedging portion of the first lead and the wedging portion of the second lead are disposed beside two opposite ends of one of cater-corners of the light-emitting portion.

10. The light source module according to claim 6, wherein the connecting portion is perpendicular to the crook portion.

11. The light source module according to claim 6, wherein each of the point light sources is a light emitting diode or a laser.

12. The light source module according to claim 6, further comprising a diffusion plate disposed above the light source assembly.

13. The light source module according to claim 6, wherein the point light sources of each light source assembly are arranged in a line.

14. The light source module according to claim 6, further comprising:
a base having a circuit board, the at least one light source assembly being disposed on the circuit board and being electrically connected to the circuit board; and a transparent cover combined with the base and covering the circuit board and the at least one light source assembly.

* * * * *